United States Patent
Hung et al.

(10) Patent No.: US 9,412,745 B1
(45) Date of Patent: Aug. 9, 2016

(54) SEMICONDUCTOR STRUCTURE HAVING A CENTER DUMMY REGION

(71) Applicant: UNITED MICROELECTRONICS CORP., Hsin-Chu (TW)

(72) Inventors: Ching-Wen Hung, Tainan (TW); Jia-Rong Wu, Kaohsiung (TW); Yi-Hui Lee, Taipei (TW); Chih-Sen Huang, Tainan (TW); Yi-Wei Chen, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/620,212

(22) Filed: Feb. 12, 2015

(51) Int. Cl.
- *H01L 29/66* (2006.01)
- *H01L 27/32* (2006.01)
- *H01L 27/11* (2006.01)
- *H01L 29/78* (2006.01)
- *H01L 29/06* (2006.01)
- *H01L 23/535* (2006.01)

(52) U.S. Cl.
CPC .......... *H01L 27/1104* (2013.01); *H01L 23/535* (2013.01); *H01L 29/0649* (2013.01); *H01L 29/7851* (2013.01); *H01L 27/3223* (2013.01); *H01L 29/66545* (2013.01)

(58) Field of Classification Search
CPC ....................... H01L 27/3223; H01L 29/66545
See application file for complete search history.

(56) References Cited

U.S. PATENT DOCUMENTS

| | | | | |
|---|---|---|---|---|
| 6,903,428 B2 * | 6/2005 | Lee | ...................... | H01L 23/585 257/401 |
| 7,153,781 B2 * | 12/2006 | Lee | .................. | H01L 21/28123 257/E21.206 |
| 7,236,396 B2 | 6/2007 | Houston | | |
| 7,663,237 B2 * | 2/2010 | Peng | .................. | H01L 21/76895 257/750 |
| 8,207,611 B2 * | 6/2012 | Saeki | ................ | H01L 21/28273 257/773 |
| 8,772,056 B2 * | 7/2014 | Wang | ..................... | H01L 21/324 257/368 |
| 9,009,641 B2 * | 4/2015 | Becker | .................. | H01L 27/092 716/118 |
| 9,240,221 B2 * | 1/2016 | Terada | .................... | G11C 5/063 |
| 2005/0070033 A1 * | 3/2005 | Kajiyama | ............. | H01L 27/228 438/3 |
| 2007/0170547 A1 * | 7/2007 | Chang | ............... | H01L 21/76838 257/532 |
| 2007/0249151 A1 * | 10/2007 | Kadoya | ............. | H01L 21/76897 438/597 |
| 2010/0216293 A1 * | 8/2010 | Kwon | ............... | H01L 21/28123 438/303 |
| 2012/0025316 A1 * | 2/2012 | Schultz | .................. | H01L 21/845 257/368 |
| 2013/0141963 A1 | 6/2013 | Liaw | | |
| 2014/0097493 A1 * | 4/2014 | Baek | ...................... | H01L 27/347 257/347 |
| 2015/0035065 A1 * | 2/2015 | Park | ...................... | H01L 27/105 257/368 |
| 2015/0249052 A1 * | 9/2015 | Ikeda | ................ | H01L 27/10891 257/327 |
| 2016/0055290 A1 * | 2/2016 | Weng | .................. | G06F 17/5081 257/401 |

* cited by examiner

*Primary Examiner* — Ida M Soward

(74) *Attorney, Agent, or Firm* — Winston Hsu; Scott Margo

(57) ABSTRACT

A semiconductor structure is provided, including a substrate, a plurality of first semiconductor devices, a plurality of second semiconductor devices, and a plurality of dummy slot contacts. The substrate has a device region, wherein the device region includes a first functional region and a second functional region, and a dummy region is disposed therebetween. The first semiconductor devices and a plurality of first slot contacts are disposed in the first functional region. The second semiconductor devices and a plurality of second slot contacts are disposed in the second functional region. The dummy slot contacts are disposed in the dummy region.

20 Claims, 17 Drawing Sheets

SEMICONDUCTOR STRUCTURE HAVING A CENTER DUMMY REGION

BACKGROUND OF THE INVENTION

1. Field of the Invention

The present invention is related to a semiconductor structure, and more particularly, to a semiconductor structure having dummy slot contacts in dummy regions.

2. Description of the Prior Art

In recent years, as various kinds of consumer electronic products are being constantly modified towards increased miniaturization, the size of semiconductor components are modified to be reduced accordingly, in order to meet high integration, high performance, low power consumption, and the demands of products.

However, with the increasing miniaturization of electronic products, current planar FETs no longer meet the requirements of the products. Thus, non-planar FETs such as Fin-shaped FETs (Fin-FET) have been developed, which includes a three-dimensional channel structure. The manufacturing processes of Fin-FET devices can be integrated into traditional logic device processes, and thus are more compatible. In addition, since the three-dimensional structure of the Fin-FET increases the overlapping area between the gate and the substrate, the channel region is controlled more effectively. This therefore reduces drain-induced barrier lowering (DIBL) effect and short channel effect. Moreover, the channel region is longer for the same gate length. Therefore, the current between the source and the drain is increased. In current years, the development of the Fin-FETS is still aiming to devices with smaller scales.

SUMMARY OF THE INVENTION

For achieving a device with better electrical performance, the present invention therefore provides a semiconductor structure having dummy slot contacts in dummy regions, particularly in memory regions.

According to one embodiment, a semiconductor structure is provided, comprising a substrate, a plurality of first semiconductor devices, a plurality of second semiconductor devices, and a plurality of dummy slot contacts. The substrate has a device region, wherein the device region comprises a first functional region and a second functional region, and a dummy region is disposed therebetween. The first semiconductor devices and a plurality of first slot contacts are disposed in the first functional region. The second semiconductor devices and a plurality of second slot contacts are disposed in the second functional region. The dummy slot contacts are disposed in the dummy region.

It is one salient feature that the semiconductor structure has dummy slot contacts in dummy regions between two functional regions, for example, one pick-up region and one 6T SRAM region. By setting these dummy floating slot contacts, the slot contacts in two adjacent functional regions can be formed precisely in desired location, avoiding short phenomenon or bridging problem in conventional arts.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in detail. The preferred embodiments of the present invention are illustrated in the accompanying drawings with numbered elements.

Please see FIG. 1A, FIG. 1B, FIG. 2A, FIG. 2B, FIG. 3A, FIG. 3B, FIG. 4A and FIG. 4B showing schematic diagrams of the semiconductor structure and method for forming the same according to the first embodiment of the present invention, wherein FIG. 1A, FIG. 2A, FIG. 3A, FIG. 4A are top view, and FIG. 1B, FIG. 2B, FIG. 3B, FIG. 4B are cross-sectional view taken along line QQ' of FIG. 1A, FIG. 2A, FIG. 3A, FIG. 4A, FIG. 5A, respectively.

Figure 1A:
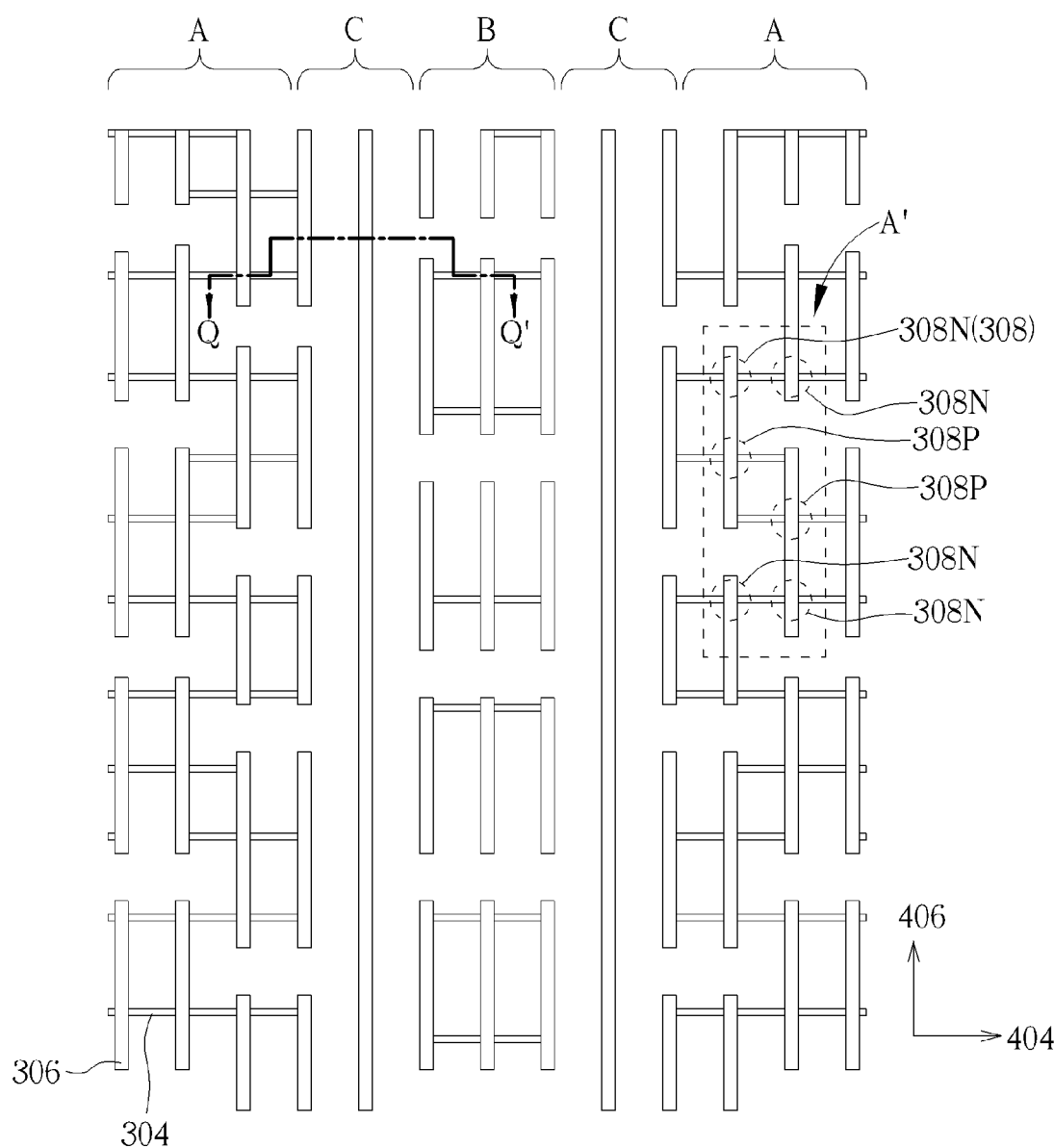
FIG. 1A, FIG. 1B, FIG. 2A, FIG. 2B, FIG. 3A, FIG. 3B, FIG. 4A and FIG. 4B show schematic diagrams of the semiconductor structure and method for forming the same according to the first embodiment of the present invention.
Figure 1B:
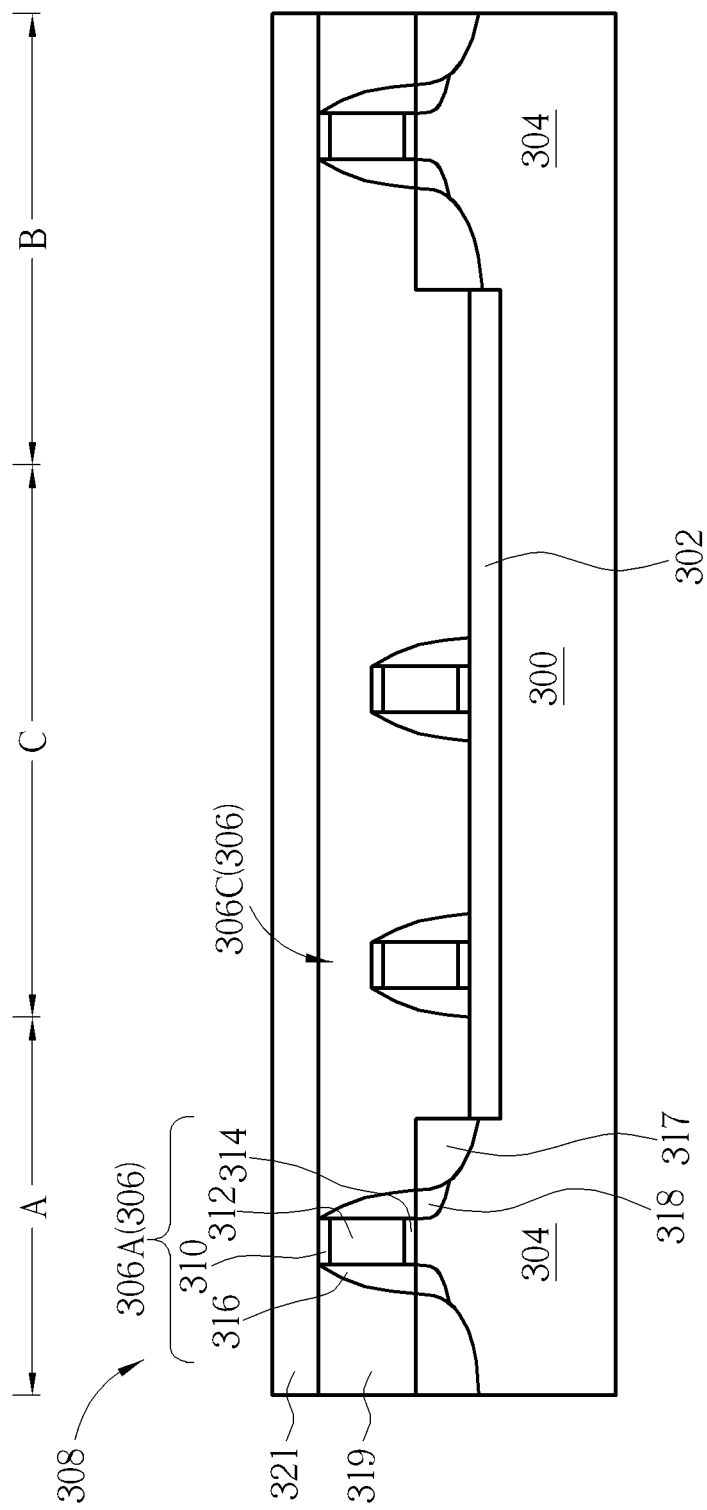
Figure 13:
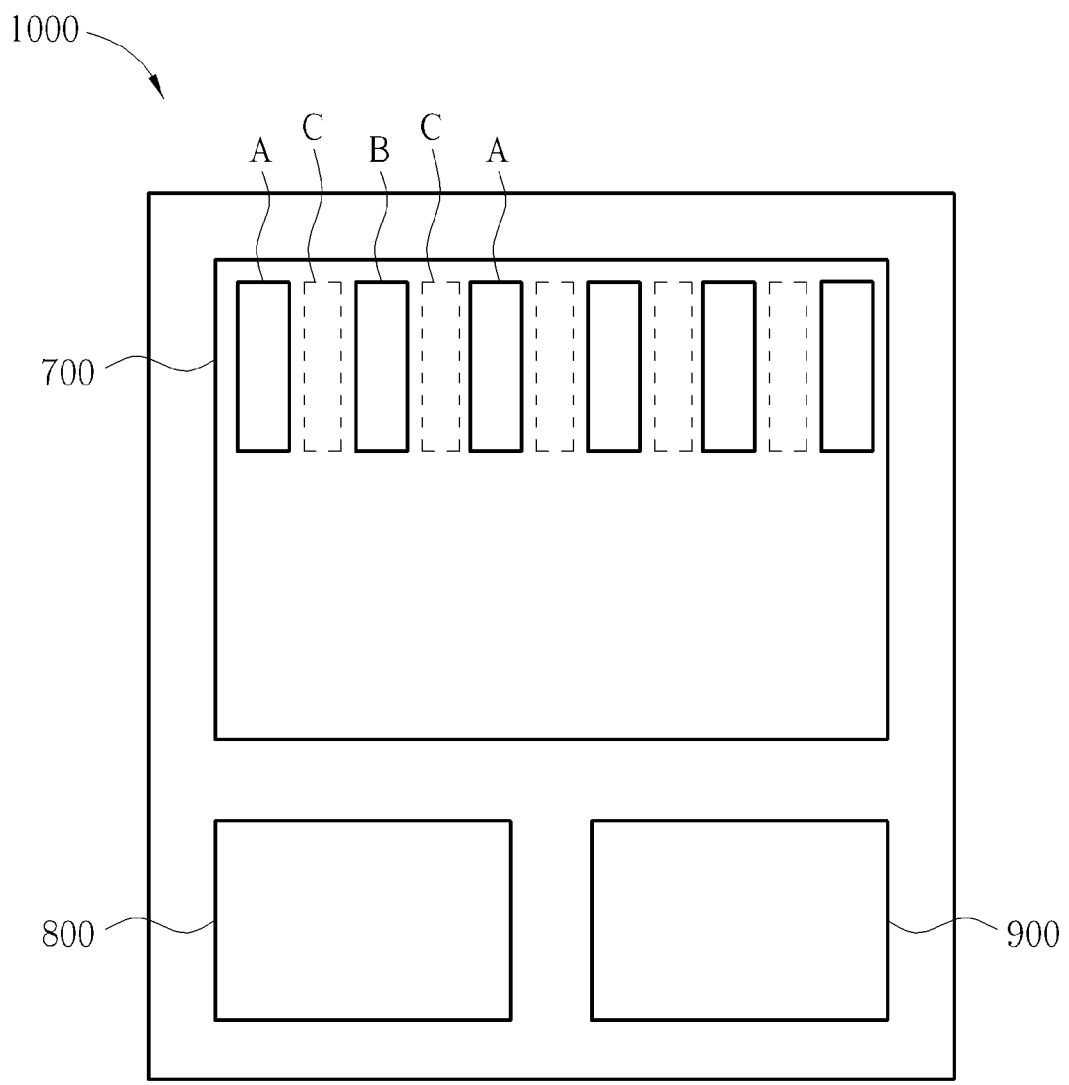
FIG. 13 shows a schematic diagram of the chip having semiconductor structures according to one embodiment of the present invention.

Please see FIG. 1A and FIG. 1B first. A substrate 300 is provided to serve as a base for forming devices, components, or circuits. The substrate 300 is preferably composed of a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si and combinations and multi-layered materials thereof. The semiconductor substrate 300 may also be composed of other semiconductor materials, such as germanium, and compound semiconductor substrates, such as type III/V semiconductor substrates, e.g., GaAs. Although the semiconductor substrate 300 is depicted as a bulk semiconductor substrate, the arrangement of a semiconductor on an insulator substrate, such as silicon-on-insulator (SOI) substrates, is also suitable for the semiconductor substrate 300. At least three regions including a plurality of regions A, a plurality of regions B and a plurality of regions C are defined on the substrate 300. In one embodiment, regions A and regions B are functional regions, meaning that the structures in regions A and regions B may execute some functions and may receive some signals or currents and output some results. In comparison, regions C, which are located between two functional regions, is designed to have a minimum space because of the manufacturing design rule according to the functional regions so the structures in region C are generally dummy devices. In one embodiment, regions A, regions B and regions C are all in a memory region on a chip. Please refer to FIG. 13, showing a schematic diagram of the chip according to one embodiment of the present invention. As shown, a chip 1000 has a memory region 700 with regions A, regions B and regions C disposed therein, in which regions A and regions B are arranged alternatively, and each region C is disposed between one region A and one region B. In one embodiment, each region A are 8K memory cell region and a plurality of memory cells are disposed therein, regions B are pick-up regions for providing grounding routes for the substrate 300. In another embodiment, both regions A and regions B are memory cell regions. In one embodiment, there are only memory cells and pick up structures instead of other passive or active components disposed in the memory region 700. It is understood that the chip 1000 can further has a CPU region 800 and/or a FR region 900, but is not limited thereto.

Please refer back to FIG. 1A and FIG. 1B. A plurality of fin structures 304, a plurality of shallow trench isolations (STI) 302 and a plurality of gate structures 306 are formed on the substrate 300. The fin structures 304 stretch along a first direction 404, being encompassed by the STIs 302 and protruding thereover. The method for forming the fin structure 304 includes, for example, forming a patterned hard mask layer (not shown) on the substrate 300, performing an etching process to form a plurality of trenches (not shown) in the substrate 300, filling an insulating material such as $SiO_2$ into the trenches, and performing a planarization and/or etching process to form said STIs 302. The protruding portion of the substrate 300 above STI 302 therefore becomes the fin structures 304. The gate structures 306 stretch along a second direction 406 and straddle over the fin structures 304 and the STIs 302. The second direction 406 is preferably perpendicular to the first direction 404. The intersecting fin structures 304 and the gate structures 306 constitute a plurality of transistors 308. In one embodiment, region A is a 6-transistor (6T) SRAM region and there are six transistors 308, two P-type transistors 308P and four N-type first transistors 308N to constitute one memory cell (please see region A').

For detail descriptions for the transistors 308, please see the cross-sectional view of FIG. 1B. In region A, the transistor 308 is comprised of the gate structure 306, a spacer 316, a light doped drain (LDD) region 318 and a source/drain region 317. In one embodiment, the gate structure 306 comprises a capping layer 310, a conductive layer 312 and a gate dielectric layer 314. The capping layer 310 includes, for example, silicon nitride (SiN), silicon carbide (SiC) or silicon oxynitride (SiON). In one embodiment, the capping layer 310 may be one or multi layers composed of different dielectric materials. For example, the capping layer 310 may comprise a first capping layer (not shown) and a second capping layer (not shown), which is composed of $SiO_2$ and SiN, respectively. The conductive layer 312 can include metal or poly-silicon. The gate dielectric layer 314 includes $SiO_2$ or high-k dielectric materials, such as a material having dielectric constant greater than 4. The spacer 316 is disposed on at least a sidewall of the gate structure 306. The spacer 316 can be a single layer or a composite layer, which is composed of high temperature oxide (HTO), silicon nitride, silicon oxide or silicon nitride (HCD-SiN) formed by hexachlorodisilane ($Si_2Cl_6$). The LDD region 318 is disposed in the fin structure 304 and has a predetermined conductive type dopant. In P-type transistor 308P, the predetermined conductivity type dopant is P type dopant, such as boron (B) and/or boron fluoride (BF). Conversely, in N-type transistor 308N, the predetermined conductivity type dopant an N-type dopant such as arsenic (As) and/or phosphorus (P) and/or antimony (Sb), but are not limited thereto. The source/drain region 317 is disposed in the fin structure 304 (or the substrate 300) at at least one side of the gate structure 306 and has a dopant with the same conductive type with the LDD region 318. In one embodiment, the spacer 316 and the LDD region 318 are optional. In region B, the transistor may have similar components with those of the transistors in region A. In one embodiment, since region B is a pick-up region, the LDD region and/or the source/drain region in region B may have the same conductive type dopant with a well or dopant region in the substrate 300 in region B for allowing current to pass therethrough. In region C, which is a dummy region, the dummy gate structure 306C does not straddle over any fin structures 304 and are disposed only on the STI 302, so no LDD region or source/drain region are formed in region C. In addition, the space of region C can be adjusted based on different design so two or more than two dummy gate structures 306C may be disposed in region C.

An inter-dielectric (ILD) 319 is formed on the substrate 300 for covering the transistors 308. The ILD 319 may include $SiO_2$, silicon dioxide formed by precursor tetraethyl orthosilicate (TEOS), plasma enhanced silicon dioxide formed by precursor etraethyl orthosilicate (PETEOS), but not limited thereto. Optionally, a metal gate replacement process can further be performed, including a chemical mechanism polish (CMP) process for removing the capping layer 310, removing the conductive layer 312 and/or the gate dielectric layer 314 for forming trenches (not shown), filling metal material and/or gate dielectric layer into the trench for forming a metal gate structure. In one embodiment, a cap layer 321 is formed on the ILD layer 319. The cap layer 321 can be made of different dielectric material from that of the ILD layer 319. Alternatively, they can be formed of the same material.

Figure 2A:
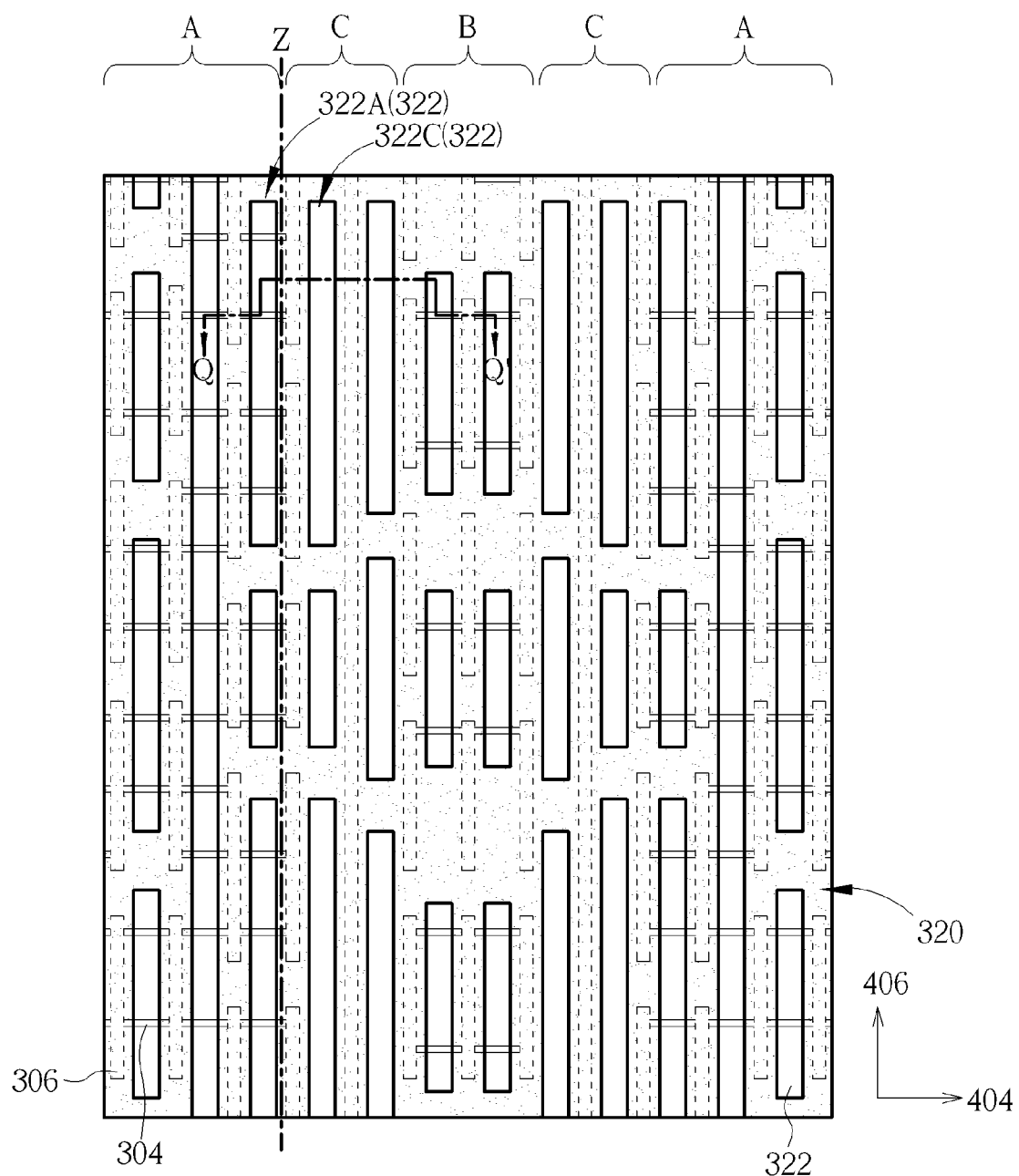
Figure 2B:
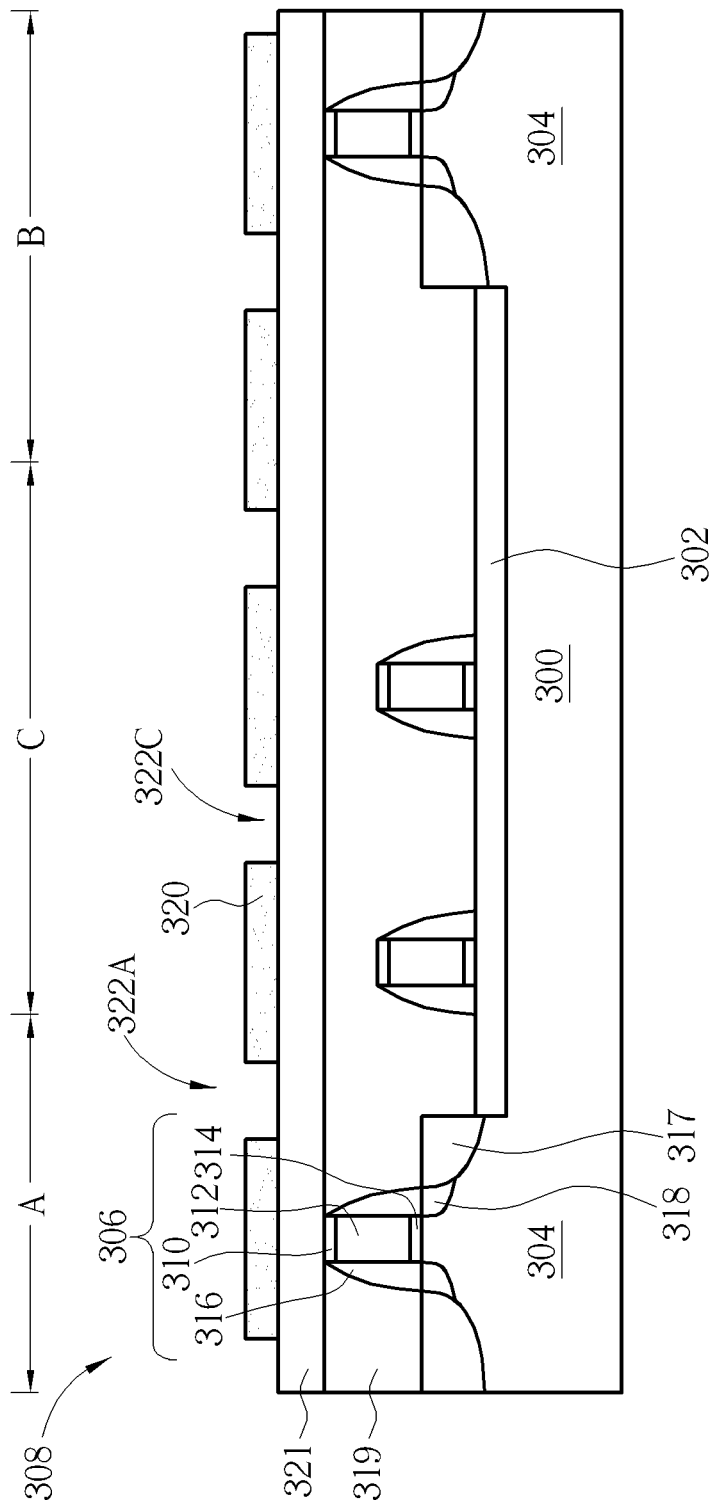

Next, as shown in FIG. 2A and FIG. 2B, a first patterned mask layer 320 having a plurality of slots 322 are formed on the cap layer 321. In one embodiment, the first patterned mask layer 320 has an etching selectivity with respect to the cap layer 321, and the material thereof can include titanium nitride (TiN), tantalum nitride (TaN), silicon nitride (SiN), silicon carbide (SiC) or silicon oxynitride (SiON), advanced pattern film (APF) supplied by the Applied Materials company, but is not limited thereto. The method for forming the first patterned mask layer 320 may include, for example, forming a first mask layer (not shown) comprehensively on the substrate 300, followed by forming a photoresist layer thereon. A photo-etching process (PEP) is carried out to form said first patterned mask layer 320 with slots 322. As shown in the top view of FIG. 2A, the slots 322 stretch along the second direction 406 and are arranged with the gate structures 306 alternatively. It is one salient feature that there are also slots 322C disposed in region C, which is a dummy region. In the present embodiment, one line or more than one line (the term "line" in the present invention refers to those semiconductor structures positioned along a continuous strip and running vertically along the second direction 406) of the slots 322C next to a border of region A and region C (border "Z" as shown in FIG. 2A) correspond to the slots 322A in region A next to border Z. In other words, the projects of the slots 322C in the same line adjacent to border Z completely match the projects of the slot 322A in the same line adjacent to border Z along the first direction 404. By doing this, the position or contour of the slots 322A would not shift during the PEP when forming the first patterned mask layer 320, since the slots 322C can compensate the diffraction of light source.

Figure 3A:
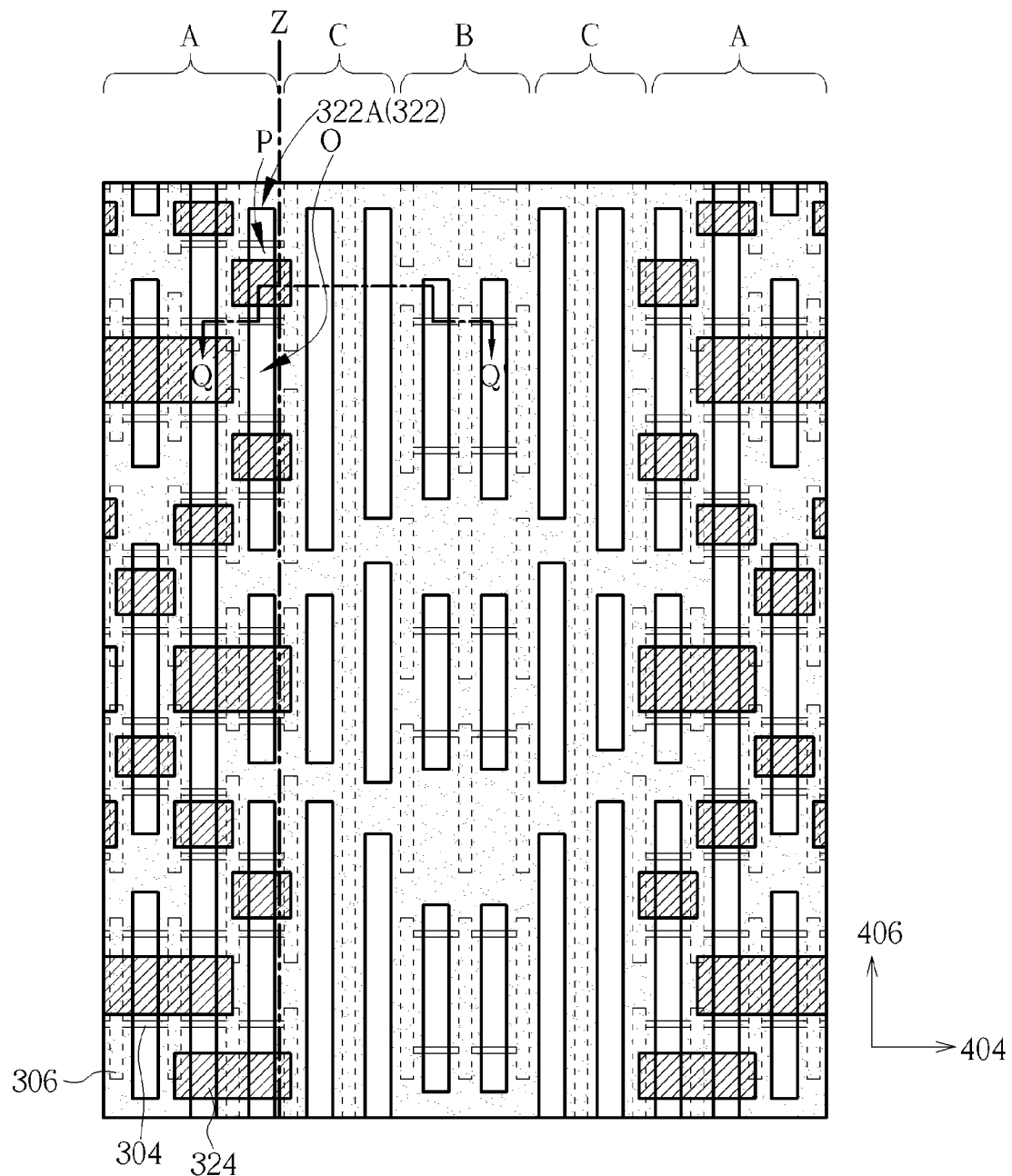
Figure 3B:
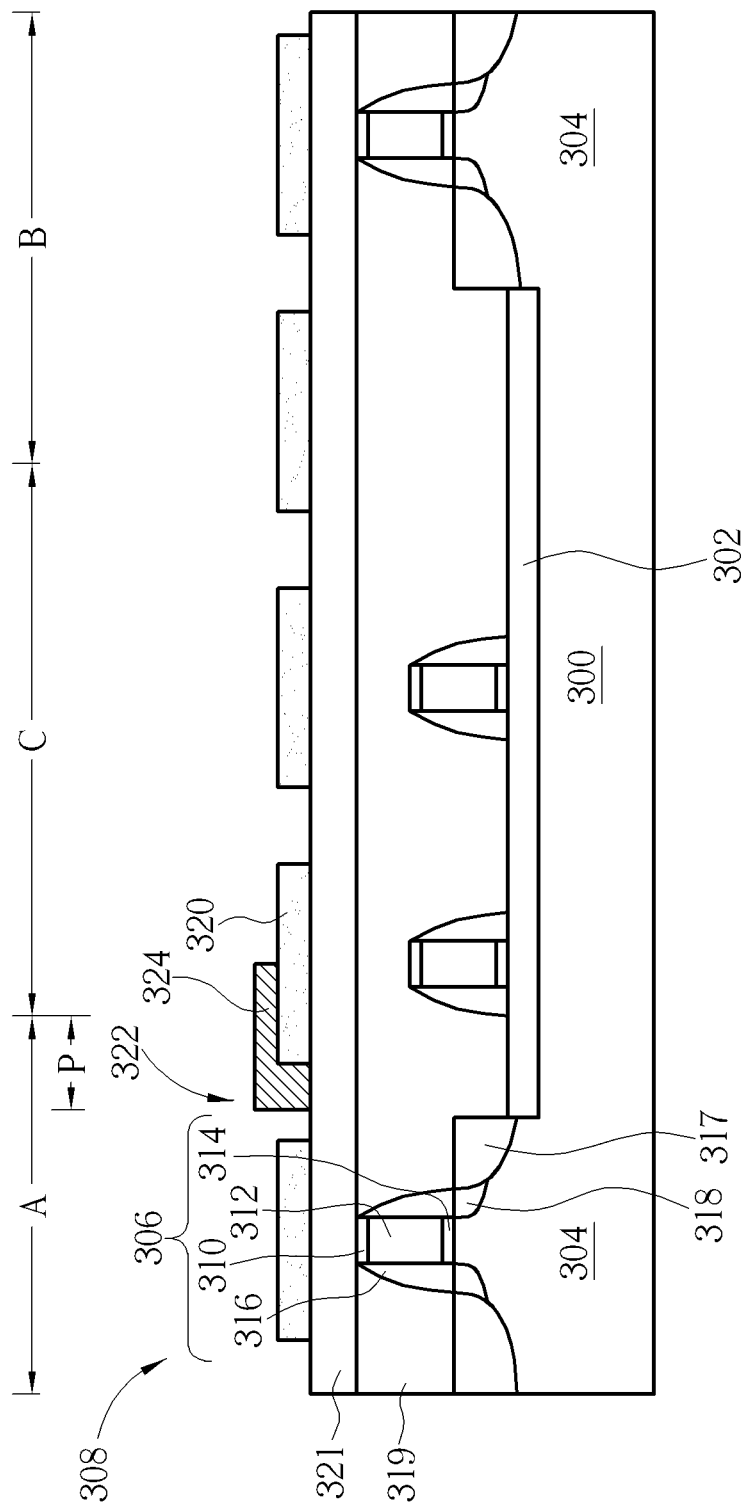

Next, as shown in FIG. 3A and FIG. 3B, a second patterned mask layer 324 is formed on the cap layer 321 and the first patterned mask layer 320. The second patterned mask layer 324 is comprised of a plurality of stripes or blocks that partially overlap with the slots 322A in region A. One single slot 322 would be overlapped (or called "cut") by one or more than one stripes or blocks of the second patterned mask layer 324. For example, in region P, the slots 322A is covered by the second patterned mask layer 324, while in region O, the same slot 322A is not covered by the second patterned mask layer 324. Thus, the under ILD layer 319 in region P is not exposed (please also see FIG. 3B) while the ILD layer 319 in region O is exposed. In the present embodiment, there are no second patterned mask layer 324 disposed in region B and region C. The material of the second patterned mask layer 324 has an etching selectivity with respect to the first patterned mask layer 320 and the cap layer 321, and can be selected from a group consisting of titanium nitride (TiN), tantalum nitride (TaN), silicon nitride (SiN), silicon carbide (SiC) or silicon oxynitride (SiON), advanced pattern film (APF), but is not limited thereto. In one embodiment, the second patterned mask layer 324 can be fabricated by a tri-layer photoresist method. For example, the tri-layer photoresist (not shown) contains a photoresist layer, an anti-reflection coating (ARC) and an auxiliary mask layer. The photoresist layer is a photoresist material suitable for light source having a wavelength of 193 nm. The ARC layer includes a silicon-containing hardmask bottom anti-reflection coating (SHB) layer and the auxiliary mask layer includes an organic dielectric layer (ODL) provided by Shin-Etsu Chemical Co. Ltd., wherein the SHB layer is disposed directly under the photoresist layer to serve as a BARC and a mask layer, and the ODL layer is an organic underlayer, i.e., a hydrocarbon, which is used to serve as an auxiliary mask layer. It is noted that the first patterned hard mask 320 can also be formed by using the tri-layer photoresist system.

Figure 4A:
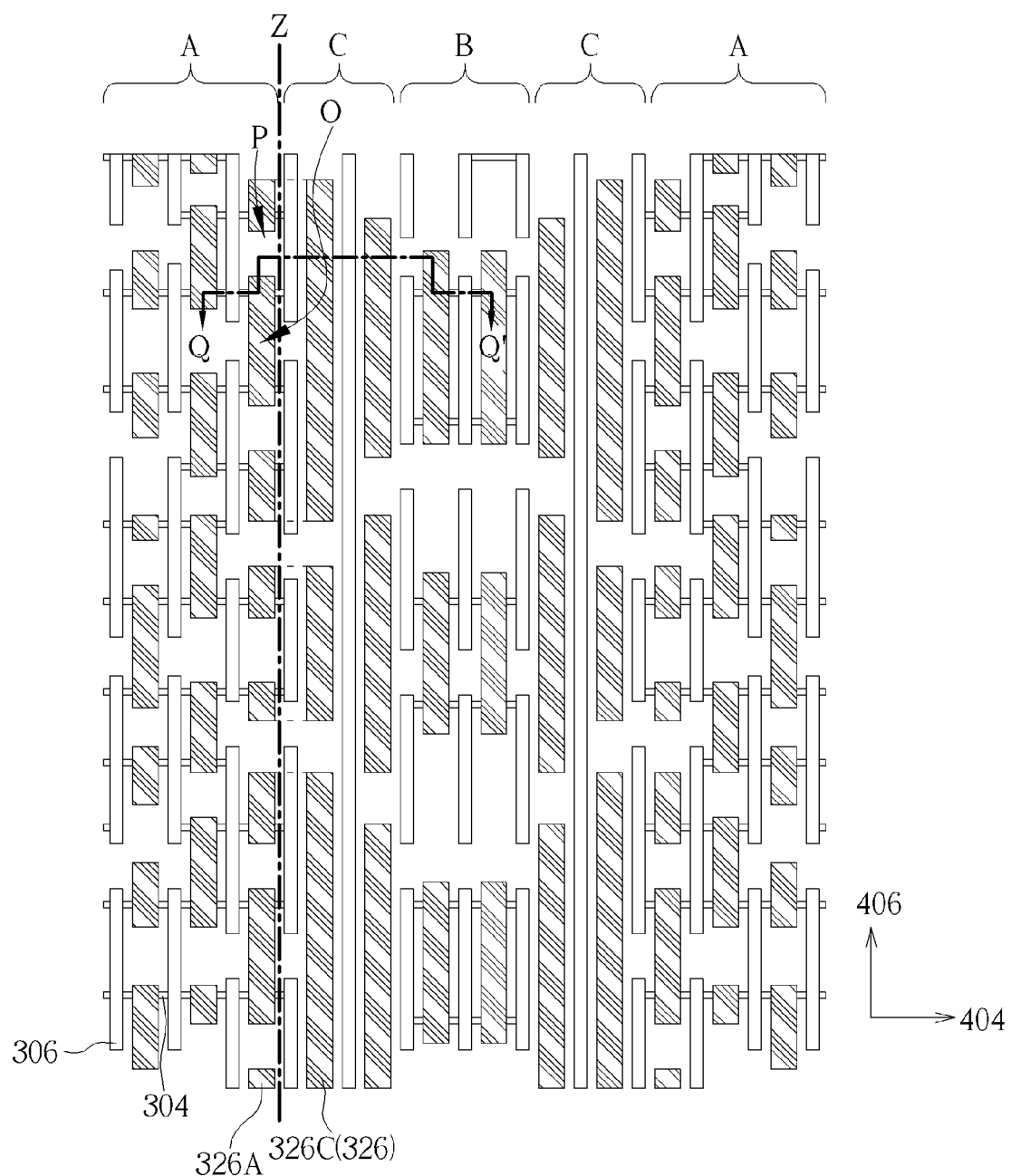
Figure 4B:
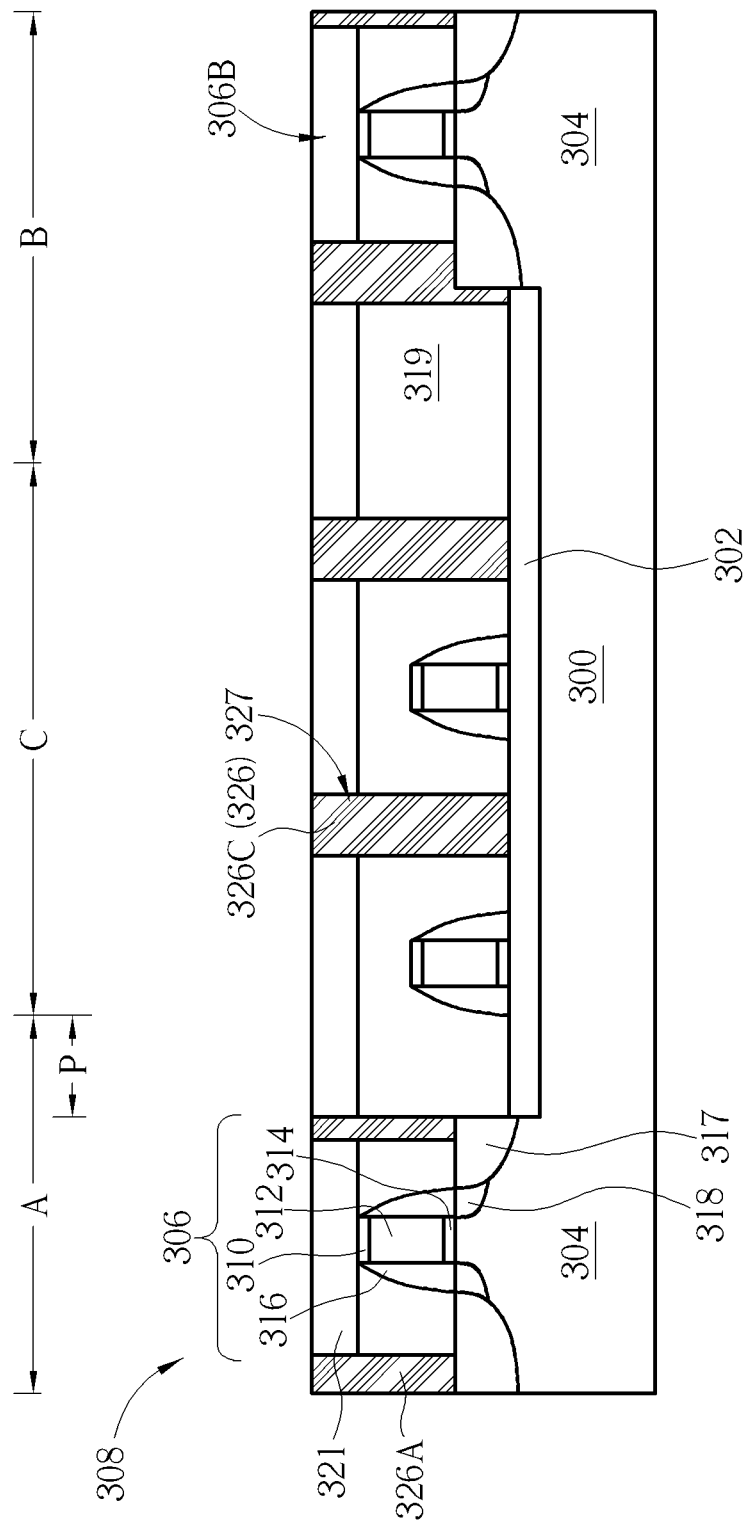

As shown in FIG. 4A and FIG. 4B, an etching process is carried out by using the first patterned mask layer 320 and the second patterned mask layer 324 as a mask to etch the cap layer 321 and the ILD layer 319, thereby forming a plurality holes 327 in the cap layer 321 and the ILD layer 319. One or more than one metal layer is then filled into the holes 327 to form a plurality of slot contacts 326, and the material of each metal layer can include titanium (Ti), titanium nitride (TiN) tantalum nitride (TaN) aluminum (Al), titanium (Ti), tantalum (Ta), tungsten (W), niobium (Nb), molybdenum (Mo), copper (Cu), but is not limited thereto. Regarding to region A, as shown in region P, since the cap layer 321 is covered by the second patterned mask layer 324, no slot contact 326 is formed therein; while in region O, the cap layer 321 is exposed by the slot 322 of the first patterned mask layer 320, and the slot contact 326 is thus formed. In region C, there are slot contacts 326C with stripe shape corresponding to the slots 322C of the first patterned mask layer 320. In this embodiment, each slot contact 326C next to border Z (also referred as "edge slot contacts") has an upper border aligned with a border of one slot contact 326A next to border Z, and has a lower border aligned with a border of another slot contact 326A (please see the dashed line in FIG. 4A). In addition, from the cross-sectional view, all the slot contacts 326C in region C completely and directly contact the STIs 302, while the slot contacts 326A may straddle over at least one fin structures 304.

Thereafter, other semiconductor components can be formed in the following steps, such as forming another dielectric layer (not shown) on the cap layer 321 and forming via plugs (not shown) for electrically connecting the slot contacts 326A and the gate structures 306A in region A. In one embodiment, the slot contacts 326C in region C are floating, so no via plugs directly contact the slot contacts 326C and the dummy gate structures 306C. In region B, via plugs may directly contact the slot contacts 326B but do not contact the gate structures 306B.

Figure 5A:
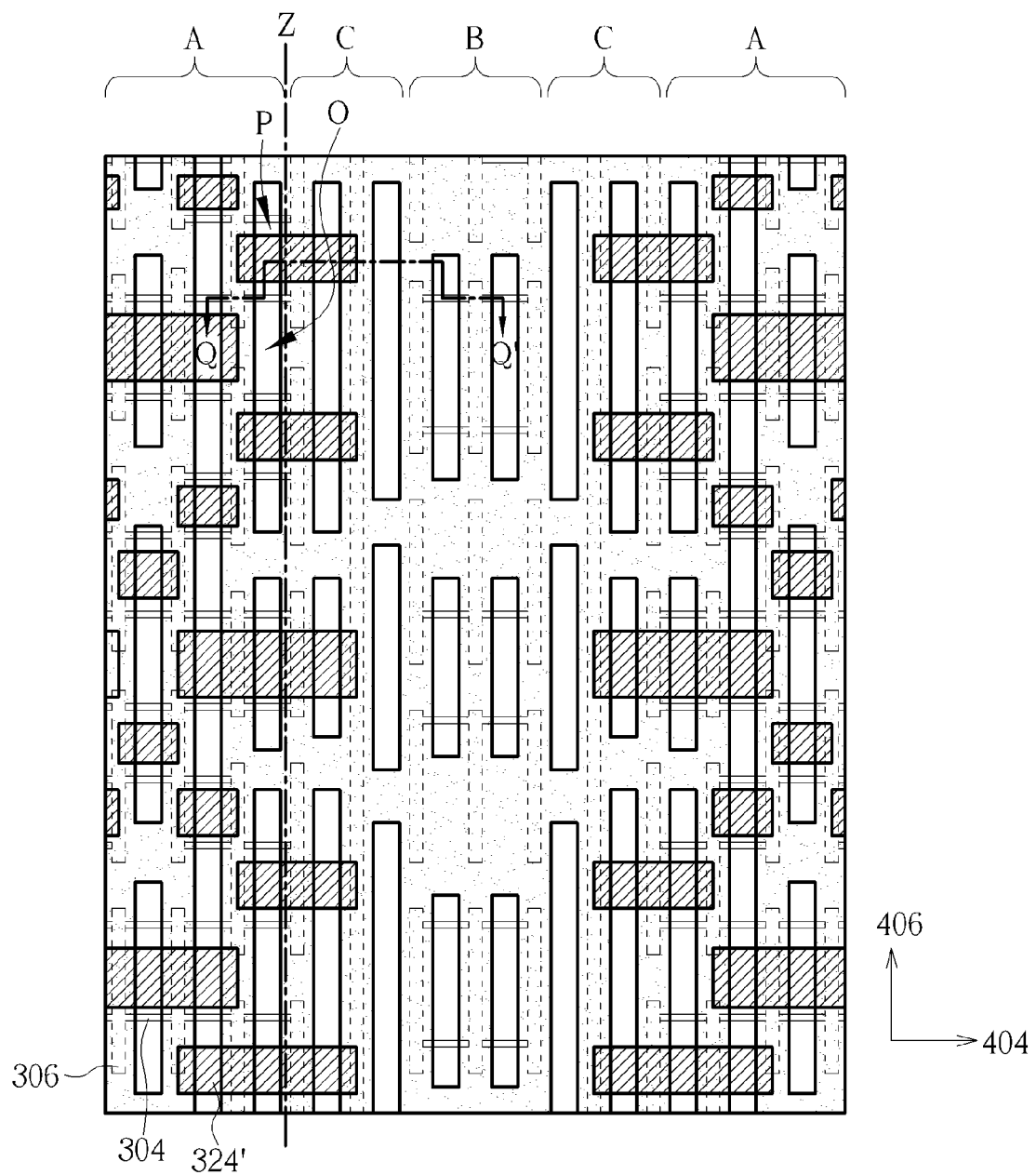
FIGS. 5A and 6A show schematic diagrams of the semiconductor structure and method for forming the same according to the second embodiment of the present invention.
Figure 6A:
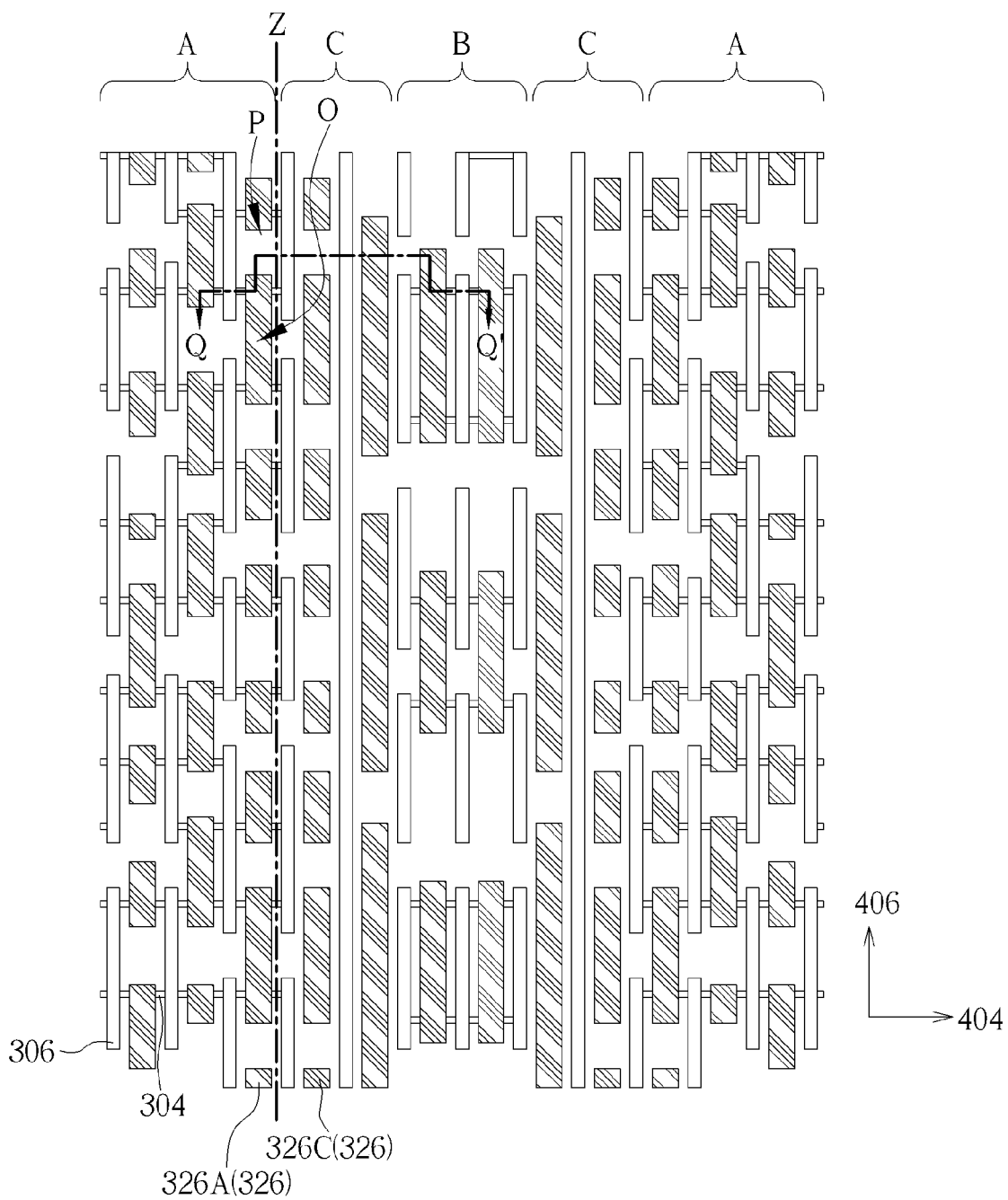

Please refer to FIG. 5A and FIG. 6A, showing schematic diagrams of the semiconductor structure and method for forming the same according to the second embodiment of the present invention, wherein FIG. 5A and FIG. 6A are top views. First, a plurality of fin structures 304 and a plurality of gate structures 306 are formed on a substrate 300, wherein details are similar to the first embodiment shown in FIG. 1A, FIG. 1B and are not repeatedly described. Next, a first patterned mask layer 320 with slots 322 is formed and the embodiment is similar to the first embodiment in FIG. 2A and FIG. 2B. Subsequently, please see FIG. 5A. A second patterned mask layer 324' is formed on the cap layer 321 and the first patterned mask layer 320. The second patterned mask layer 324' of the second embodiment further extends to region C to cover at least one line or more than one line of the slots 322. Thus, after the PEP process and filling metal material to form the slot contacts 326, please see FIG. 6A, each slot contact 326C next to border Z ("edge slot contacts") corresponds to each slot contacts 326A next to border Z, meaning that the projects of the slot contacts 326A completely match the projects of the slot contacts 326C along the first direction 404.

Figure 7A:
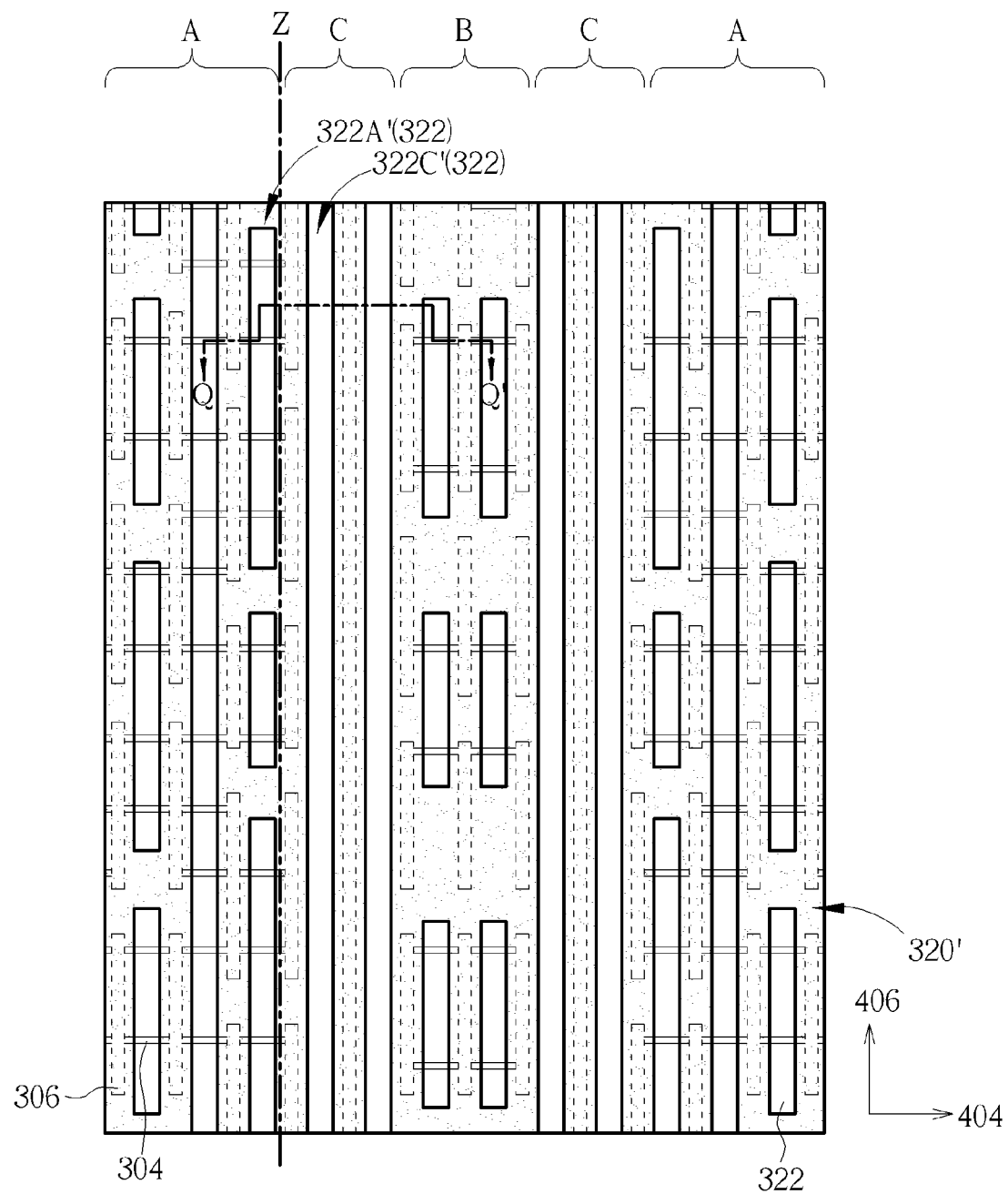
FIGS. 7A and 8A show schematic diagrams of the semiconductor structure and method for forming the same according to the third embodiment of the present invention.
Figure 8A:
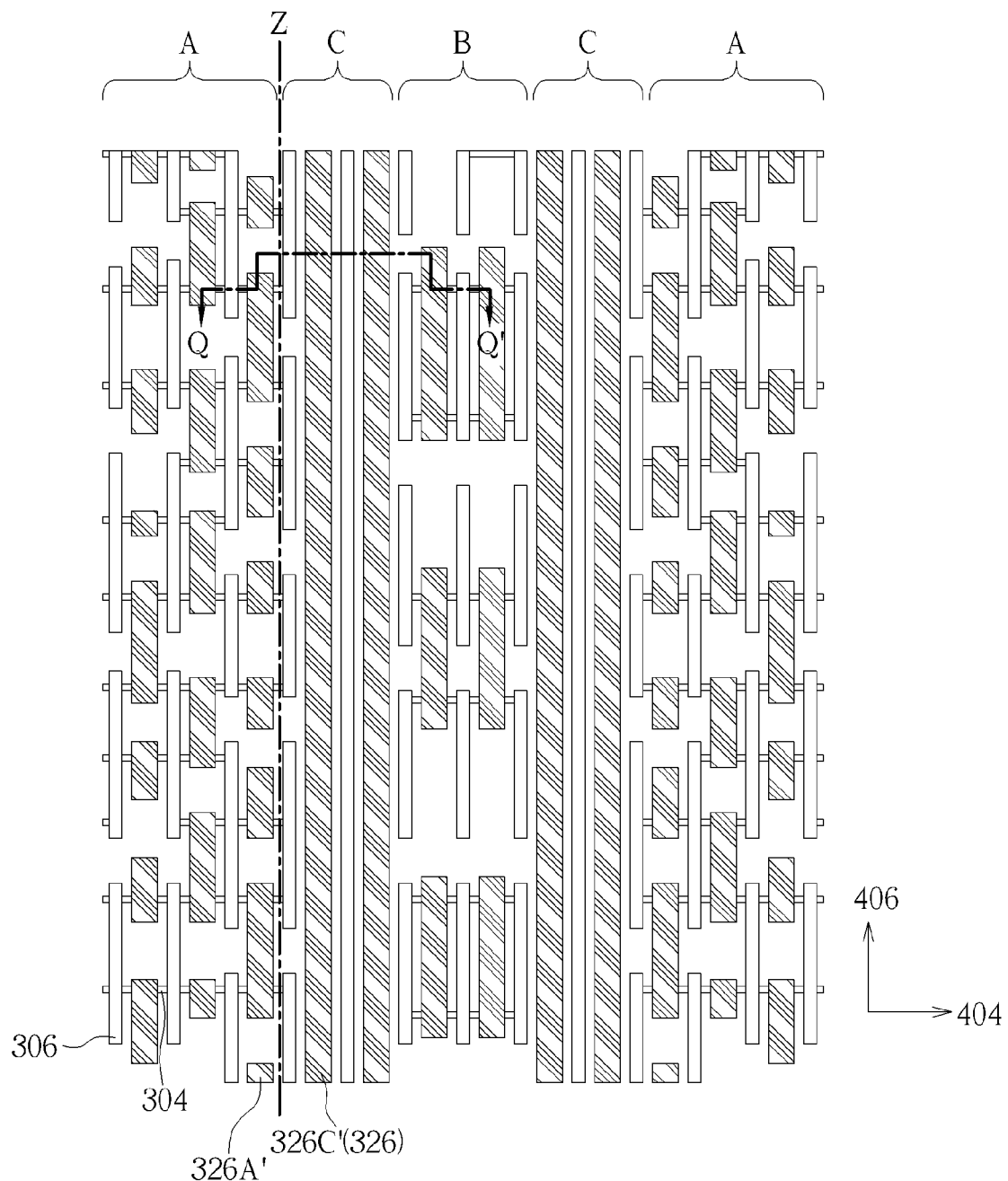

Please refer to FIG. 7A and FIG. 8A, showing schematic diagrams of the semiconductor structure and method for forming the same according to the third embodiment of the present invention, wherein FIG. 7A and FIG. 8A are top views. First, a plurality of fin structures 304 and a plurality of gate structures 306 are formed on a substrate 300, wherein details are similar to the first embodiment shown in FIG. 1A, FIG. 1B. Next, please see FIG. 7A, a first patterned mask layer 320' having slots 322' is formed on the cap layer 321. In comparison with the first embodiment, the slot 322C' in the second embodiment in region C has a continuous stripe shape that stretches through whole region C along the second direction 406. Thereafter, a second patterned mask layer 324 similar with the first embodiment in FIG. 3A is formed, and a PEP is carried out by using the first patterned mask layer 320' and the second patterned mask layer 324 as a mask to form holes 327 for forming slot contacts 326. Please see FIG. 8A, there is only one edge slot contact 326C next to the border Z, which has continuous stripe shape that stretches along region C, while there are plural slot contacts 326A' in region A.

Figure 9A:
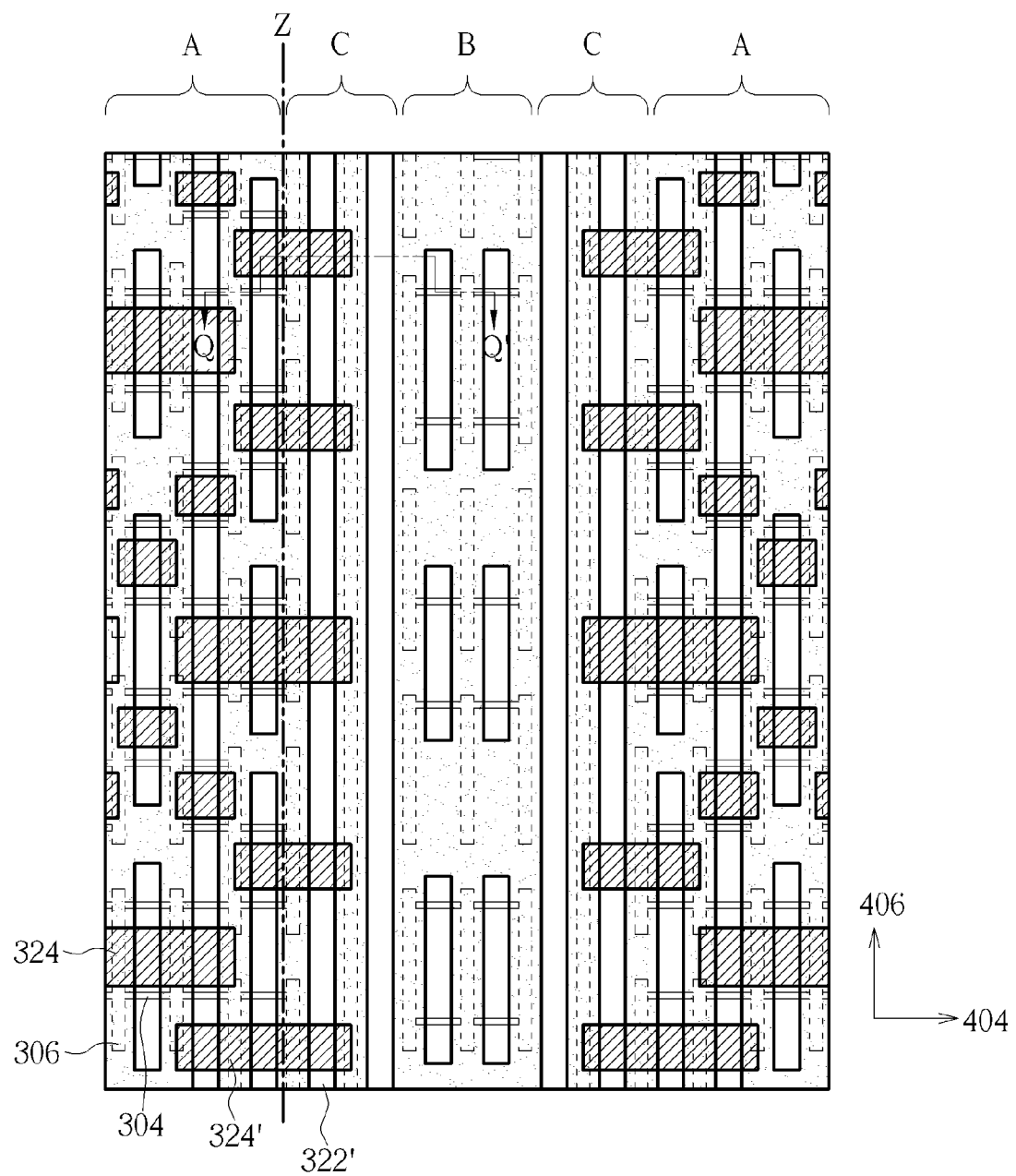
FIGS. 9A and 10A show schematic diagrams of the semiconductor structure and method for forming the same according to the fourth embodiment of the present invention.
Figure 10A:
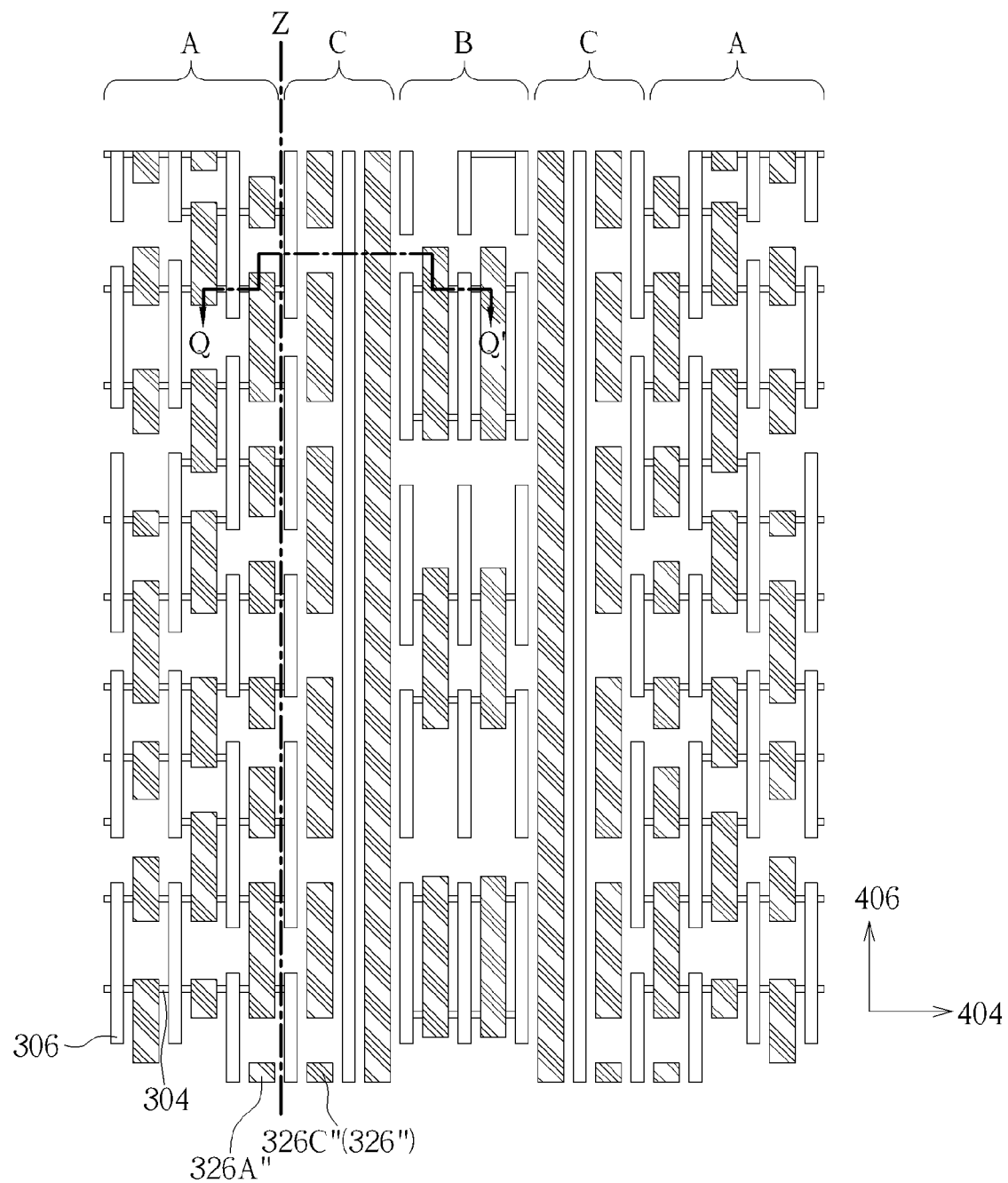

Please refer to FIG. 9A and FIG. 10A, showing schematic diagrams of the semiconductor structure and method for forming the same according to the fourth embodiment of the present invention, wherein FIG. 9A and FIG. 10A are top views. First, a plurality of fin structures 304 and a plurality of gate structures 306 are formed on a substrate 300, wherein details are similar to the first embodiment shown in FIG. 1A, FIG. 1B. Next, as shown in FIG. 7A, a first patterned mask layer 320' having slots 322' is formed on the ILD layer 319, wherein the slots 322' in region C is continuous. Subsequently, Please see FIG. 9A. A second patterned mask layer 324' is formed on the ILD layer 319 and the first patterned mask layer 320'. The second patterned mask layer 324' is similar to the second embodiment, that is, it further extends to region C to cover at least one line or more than one line of the slots 322' of the first patterned mask layer 320'. Thus, after the PEP process and filling metal material to form the slot contacts 326'', as shown in FIG. 10A, there are plural edge slot contacts 326C'' next to border Z while there is only one continuous slot contact 326C'' next to the above plural edge slot contacts 326C'''.

Figure 11A:
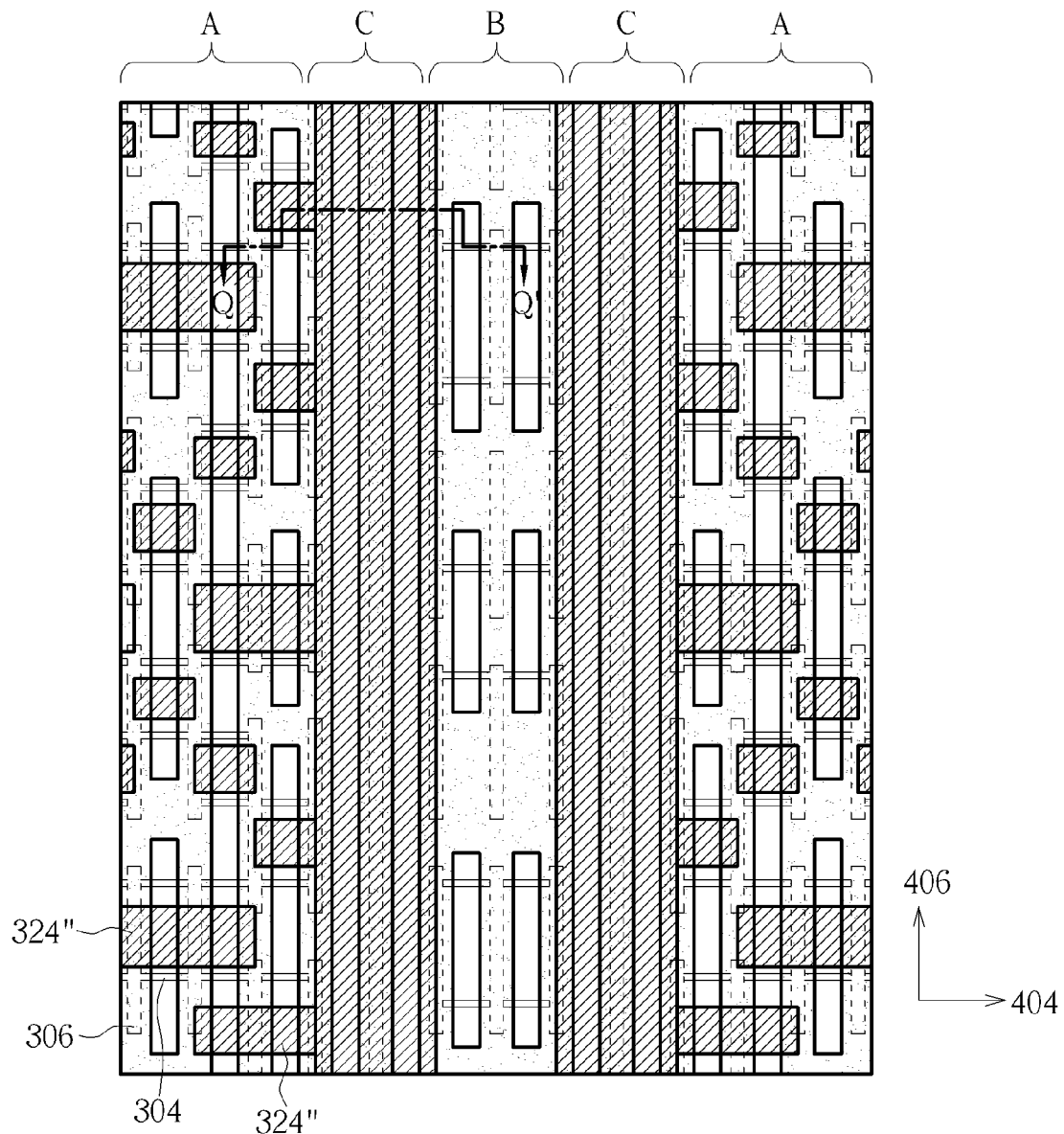
FIGS. 11A and 12A show schematic diagrams of the semiconductor structure and method for forming the same according to the fifth embodiment of the present invention.
Figure 12A:
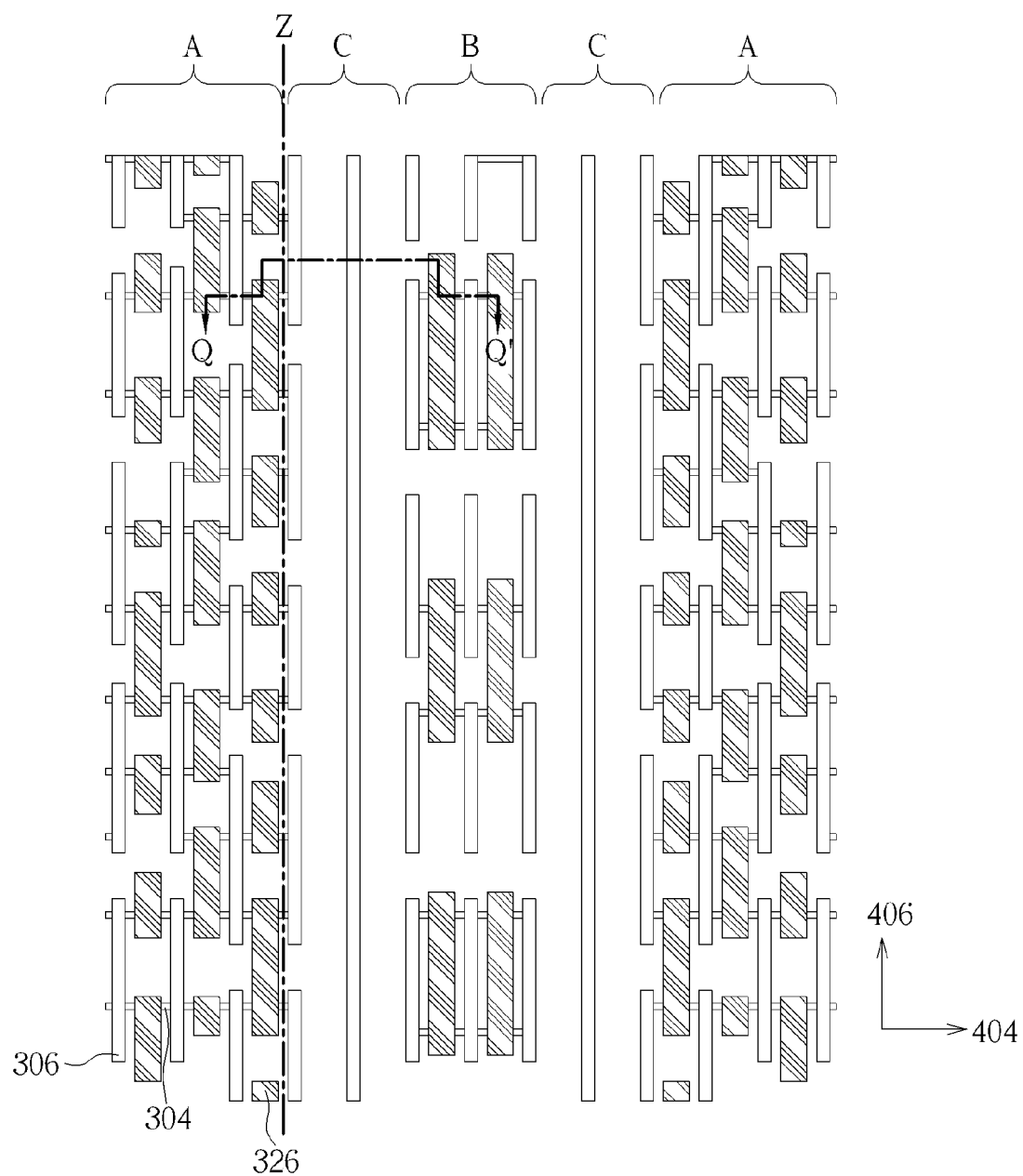

Please refer to FIG. 11A and FIG. 12A, showing schematic diagrams of the semiconductor structure and method for forming the same according to the fifth embodiment of the present invention, wherein FIG. 11A and FIG. 12A are top views. First, a plurality of fin structures 304 and a plurality of gate structures 306 are formed on a substrate, wherein details are similar to the first embodiment shown in FIG. 1A, FIG. 1B. Next, as shown in FIG. 7A, a first patterned mask layer 320' having slots 322' is formed on the ILD layer 319, wherein the slots 322' in region C is continuous. Subsequently, please see FIG. 11A. A second patterned mask layer 324" is formed on the ILD layer 319 and the first patterned mask layer 320'. The second patterned mask layer 324" in the fifth embodiment further extends to all region C to cover the slots 322' of the first patterned mask layer 320'. Thus, after the PEP process and filling metal material to form the slot contacts 326, please see FIG. 12A, there are no slot contacts 326 in region C.

It is noted that the above mentioned embodiments of the slot contacts 326C in region C can be incorporated with each other to form various embodiments. Specifically speaking, different lines of the slot contacts 326C in region C can be of any one of the embodiments including: plural stripes partially corresponding to the slot contacts 326A (FIG. 4A for example), plural stripes completely corresponding to the slot contacts 326A (FIG. 6A for example), one continuous strip (FIG. 8A for example), or no slot contacts formed (FIG. 12A for example), but is not limited thereto. Since two or more than two lines of slot contacts 326C can be formed in region C, numerous embodiments can be alternatively combined depending on the design of the products.

In summary, the present invention provides a semiconductor structure with slot contacts in dummy regions between two functional regions, for example, one pick-up region and one 6T SRAM region. By setting these dummy floating slot contacts, the slot contacts in two adjacent functional regions can be formed precisely in desired location, avoiding short phenomenon or bridging problem in conventional arts.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
    a substrate with a device region, wherein the device region is a memory region, wherein the device region comprises a first functional region and a second functional region, and a dummy region is disposed therebetween, wherein the first functional region is a memory cell region;
    a plurality of first semiconductor devices and a plurality of first slot contacts disposed in the first functional region, wherein a plurality of fin structures stretching along a first direction and a plurality of gate structures stretching along a second direction are disposed in the first functional region, intersecting with each other, thereby forming the plural first semiconductor devices;
    a plurality of second semiconductor devices and a plurality of second slot contacts disposed in the second functional region; and
    a plurality of dummy slot contacts disposed in the dummy region.

2. The semiconductor structure according to claim 1, further comprising a plurality of dummy gate structures stretching along a first direction and disposed in the dummy region.

3. The semiconductor structure according to claim 2, wherein the dummy slot contacts and the dummy gate structures are arranged alternatively.

4. The semiconductor structure according to claim 1, wherein the dummy slot contacts that are closest to the first functional region and are disposed in the same line are defined as edge dummy slot contacts.

5. The semiconductor structure according to claim 4, wherein there are more than one edge dummy slot contacts.

6. The semiconductor structure according to claim 5, wherein each edge dummy slot contact corresponds to each first slot contact closest to the dummy region.

7. The semiconductor structure according to claim 5, wherein a border of one edge dummy slot contact corresponds to a border of one first slot contact closest to the dummy region, and another border of said edge dummy slot contact corresponds to a border of another first slot contact closest to the dummy region.

8. The semiconductor structure according to claim 4, wherein there is only one edge dummy slot contact.

9. The semiconductor structure according to claim 4, wherein there are plural edge dummy slot contacts and there is only one dummy slot contact that is next to the edge dummy slot contacts.

10. The semiconductor structure according to claim 1, wherein the dummy slot contacts are floating.

11. The semiconductor structure according to claim 1, wherein the dummy slot contacts do not contact any via plugs.

12. The semiconductor structure according to claim 1, wherein all the dummy slot contacts completely and directly contact a shallow trench isolation (STI).

13. The semiconductor structure according to claim 1, wherein the first slot contacts are stretching along the second direction and arranged alternatively with the first gate structures.

14. The semiconductor structure according to claim 1, wherein the second functional region is a pick-up region.

15. The semiconductor structure according to claim 14, wherein a plurality of pick-up fin structures stretching along the first direction and a plurality of pick-up gate structures stretching along the second direction are disposed in the second functional region, intersecting with each other.

16. The semiconductor structure according to claim 15, wherein the second slot contacts are stretching along the second direction and arranged alternatively with the pick-up gate structures.

17. The semiconductor structure according to claim 1, wherein both the first functional region and the second functional region are SRAM regions.

18. A semiconductor structure, comprising:
    a substrate with a device region, wherein the device region comprises a first functional region and a second functional region, and a dummy region is disposed therebetween;
    a plurality of first semiconductor devices and a plurality of first slot contacts disposed in the first functional region;
    a plurality of second semiconductor devices and a plurality of second slot contacts disposed in the second functional region, wherein a plurality of fin structures stretching along a first direction and a plurality of gate structures stretching along a second direction are disposed in the second functional region, intersecting with each other, thereby forming the plural second semiconductor devices; and
    a plurality of dummy slot contacts disposed in the dummy region.

19. The semiconductor structure according to claim 18, further comprising a plurality of dummy gate structures stretching along the first direction and disposed in the dummy region.

20. The semiconductor structure according to claim 18, wherein the second slot contacts are stretching along the second direction and arranged alternatively with the gate structures.

* * * * *